US006924023B2

(12) United States Patent
Ohkura et al.

(10) Patent No.: US 6,924,023 B2
(45) Date of Patent: Aug. 2, 2005

(54) METHOD OF MANUFACTURING A STRUCTURE HAVING PORES

(75) Inventors: Hiroshi Ohkura, Kanagawa (JP); Tohru Den, Tokyo (JP); Tatsuya Iwasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/609,421

(22) Filed: Jul. 1, 2003

(65) Prior Publication Data

US 2004/0001964 A1 Jan. 1, 2004

Related U.S. Application Data

(62) Division of application No. 09/649,598, filed on Aug. 29, 2000, now Pat. No. 6,610,463.

(30) Foreign Application Priority Data

Aug. 30, 1999 (JP) .......................................... 11-242995
Aug. 24, 2000 (JP) ...................................... 2000-253821

(51) Int. Cl.$^7$ ................................................ B32B 1/06
(52) U.S. Cl. ........................ 428/138; 428/173; 428/188; 428/692
(58) Field of Search ................................ 428/138, 173, 428/188, 692, 694 TS, 642; 313/309, 310, 336, 351; 445/50, 51

(56) References Cited

U.S. PATENT DOCUMENTS

| | | | |
|---|---|---|---|
| 4,086,694 A | 5/1978 | U ................................. | 438/361 |
| 4,923,301 A | 5/1990 | White ........................... | 356/356 |
| 5,618,448 A * | 4/1997 | Kuroe et al. ..................... | 216/97 |
| 5,882,823 A | 3/1999 | Neary ............................. | 430/5 |
| 6,139,713 A | 10/2000 | Masuda et al. .............. | 205/206 |
| 6,214,738 B1 | 4/2001 | Aiba et al. .................... | 438/707 |
| 6,278,231 B1 * | 8/2001 | Iwasaki et al. .............. | 313/310 |
| 6,313,969 B1 * | 11/2001 | Hattori et al. ............... | 360/135 |
| 6,464,853 B1 | 10/2002 | Iwasaki et al. .............. | 205/118 |
| 6,476,409 B2 | 11/2002 | Iwasaki et al. ................ | 257/13 |
| 6,602,620 B1 * | 8/2003 | Kikitsu et al. ............ | 428/694 T |
| 2001/0028872 A1 * | 10/2001 | Iwasaki et al. ........... | 423/447.3 |
| 2002/0014621 A1 | 2/2002 | Den et al. ....................... | 257/3 |
| 2002/0034662 A1 | 3/2002 | Den .......................... | 428/692 |
| 2002/0086185 A1 * | 7/2002 | Yasui et al. ............. | 428/694 TS |
| 2003/0175472 A1 * | 9/2003 | Den et al. .................. | 428/66.6 |
| 2004/0048092 A1 * | 3/2004 | Yasui et al. ................. | 428/642 |

FOREIGN PATENT DOCUMENTS

| | | |
|---|---|---|
| EP | 0 931 859 | 7/1999 |
| EP | 0951047 A2 * | 10/1999 |
| JP | 7-171984 | 7/1995 |
| JP | 10-121292 | 5/1998 |
| JP | 11-200090 | 7/1999 |
| JP | 2000-195036 | 7/2000 |

OTHER PUBLICATIONS

Hutley, M.C. "Coherent Photofabrication", Opt. Eng., vol. 15, No. 3 (1976), pp. 190–196.
Decker, et al. "Generating . . . Reversal," J. Vac. Sci. Technol. B15(6), Nov. 1997 pp. 1949–1953.
Furneaux, et al. "The formation . . . aluminum", Nature, vol. 337, p. 147–149 (1989).
Masuda, "Anodically . . . High Level"; Solid State Phys. , vol. 3, No. 5, pp. 493–499 (1996).
Hideki Masuda et al., "Fabrication of Gold Nanodot Array Using Anodic Porous Alumina as an Evaporation Mask," 35 *Jpn. J. Appl. Phys.* L126–L129 (1996).
O. Jessensky et al., "Self–Organized Formation of Hexagonal Pore Arrays in Anodic Alumina," 72(10) *Appl. Phys. Lett.* 1173–1175 (Mar. 1998).

* cited by examiner

*Primary Examiner*—Kevin M. Bernatz
(74) *Attorney, Agent, or Firm*—Fitzpatrick, Cella, Harper & Scinto

(57) ABSTRACT

A method of manufacturing a nonostructure, which enables cylindrical pores arrayed according to any periodic pattern to be easily made on a substrate over a large area at a low cost in a short period of time. The method of manufacturing a structure having such pores includes the steps of preparing a substrate having recesses in its surface, providing a film on the surface of the substrate and anodizing the film.

9 Claims, 16 Drawing Sheets

FIG. 1A1 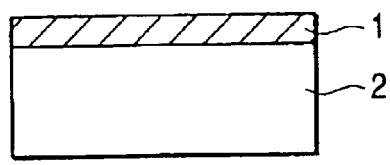
FIG. 1A2 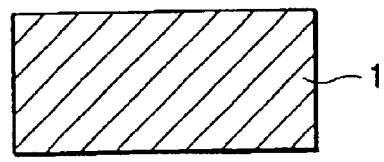
FIG. 1B1 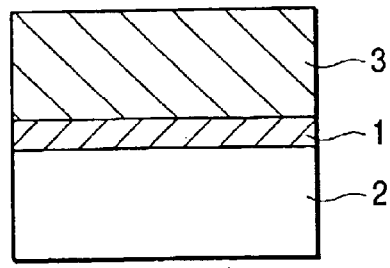
FIG. 1B2 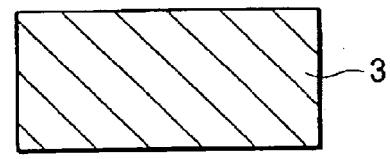
FIG. 1C1 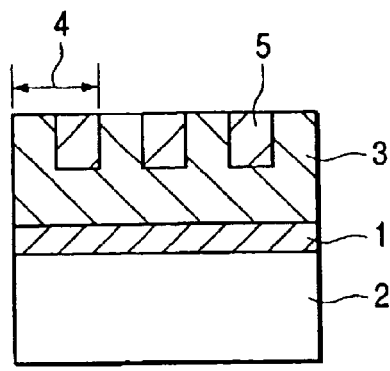
FIG. 1C2 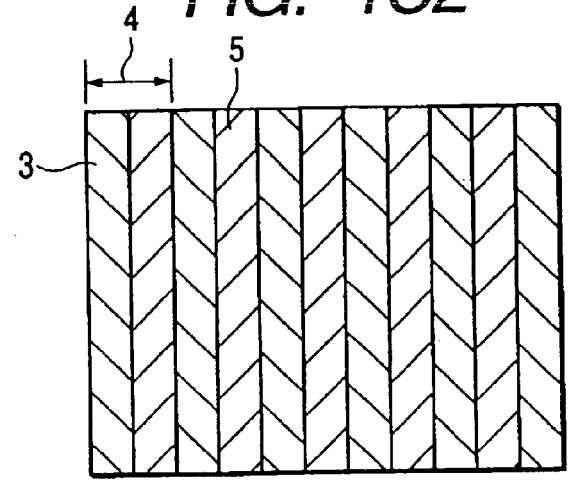

FIG. 1D1
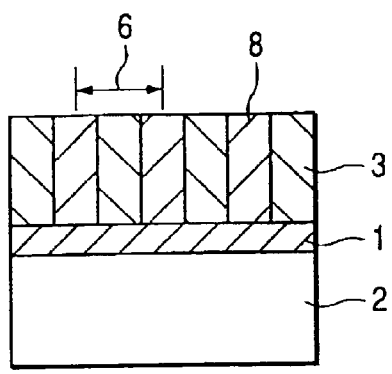
FIG. 1D2
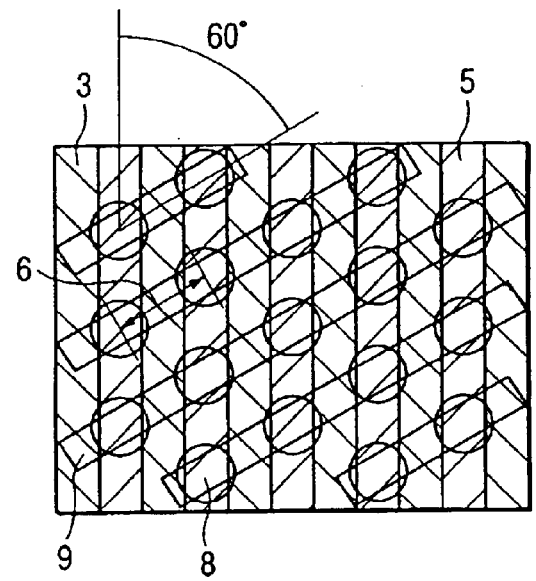
FIG. 1E1
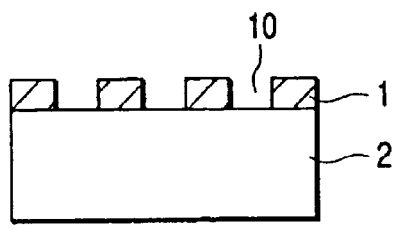
FIG. 1E2
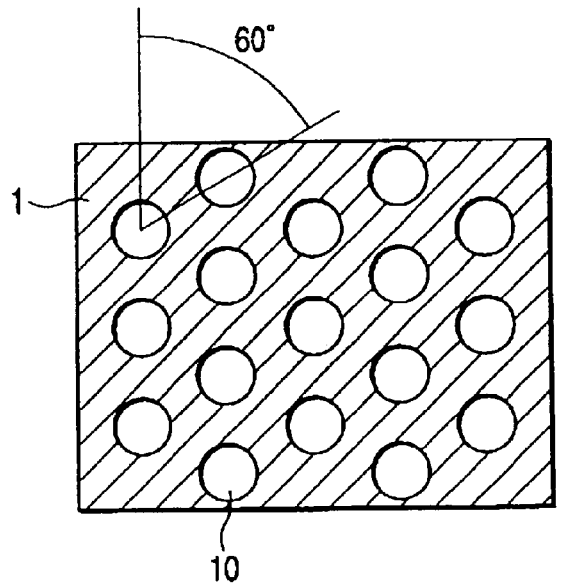

FIG. 1F1
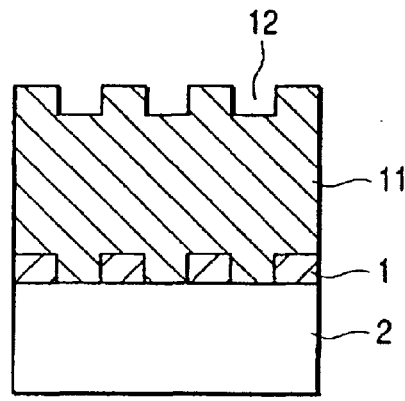
FIG. 1F2
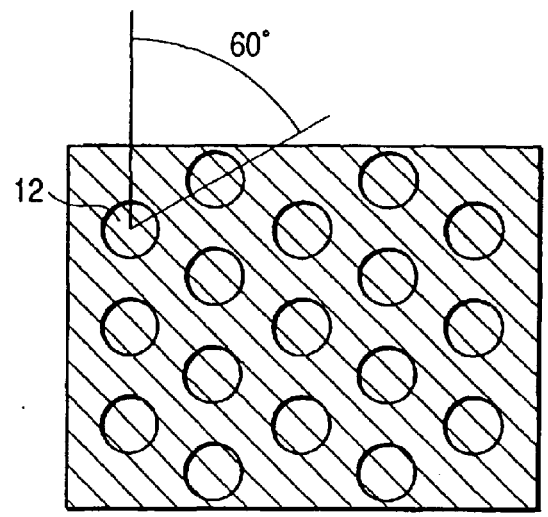
FIG. 1G1
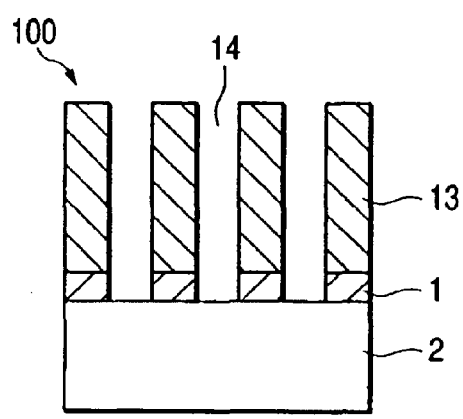
FIG. 1G2
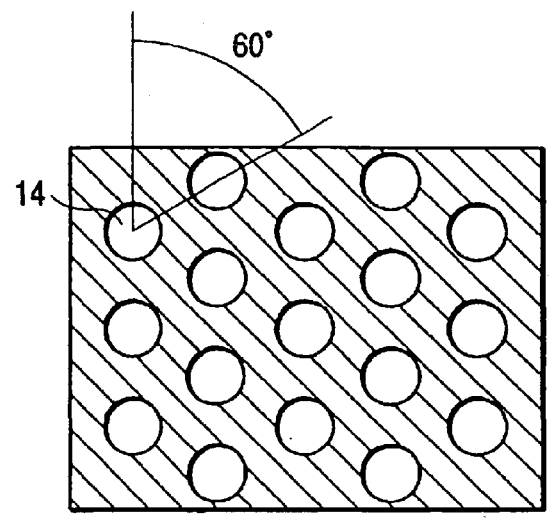

FIG. 2A1 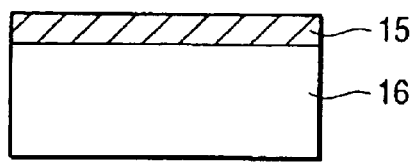
FIG. 2A2 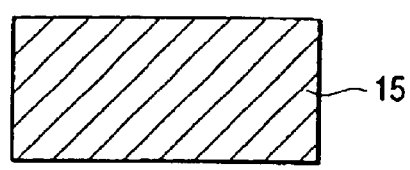
FIG. 2B1 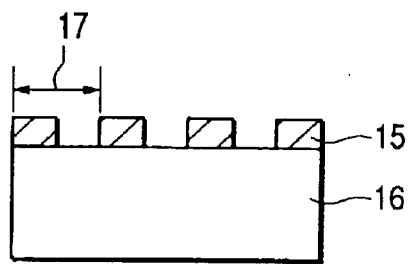
FIG. 2B2 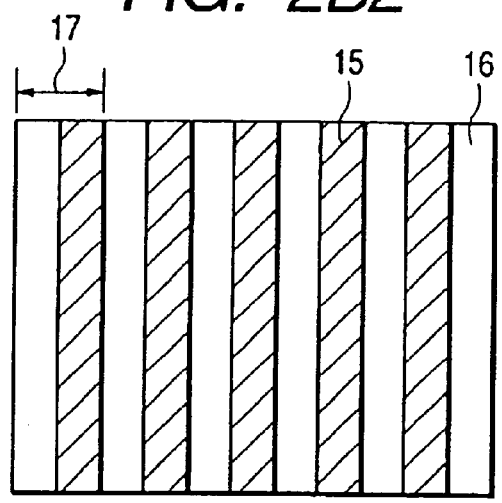
FIG. 2C1 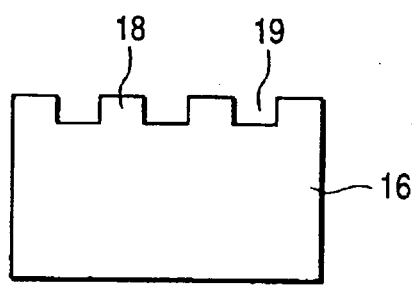
FIG. 2C2 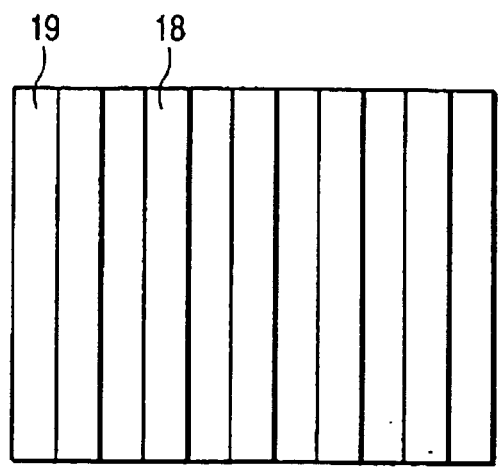

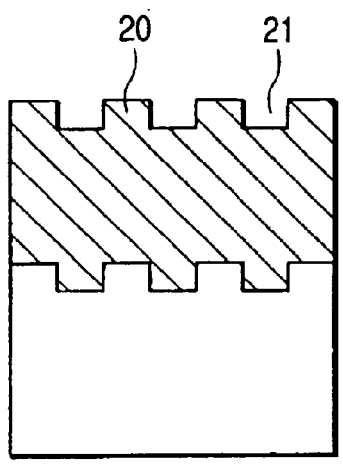
FIG. 2D1
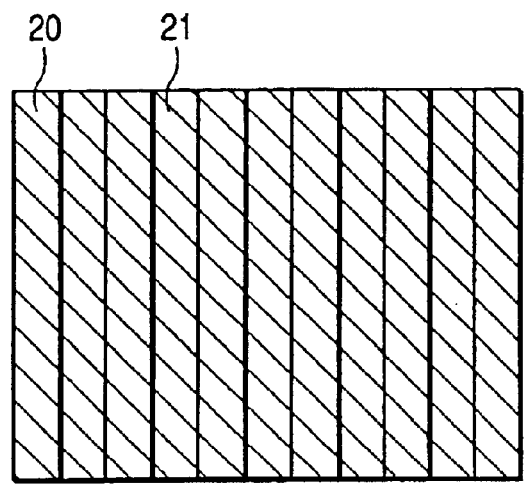
FIG. 2D2
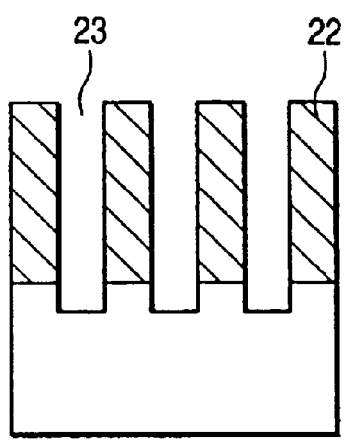
FIG. 2E1
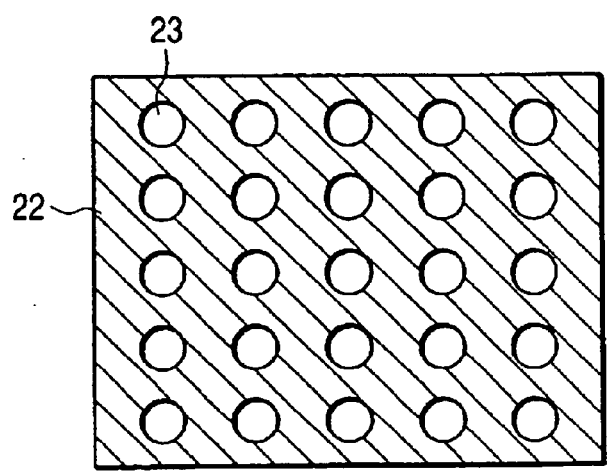
FIG. 2E2

FIG. 3A1
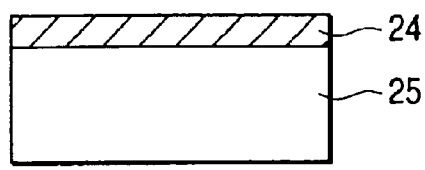
FIG. 3A2
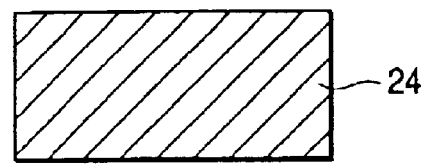
FIG. 3B1
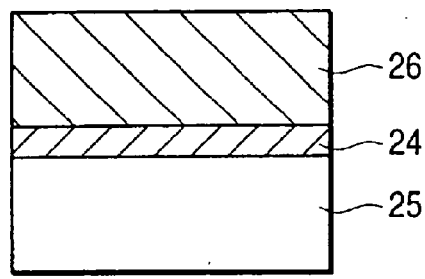
FIG. 3B2
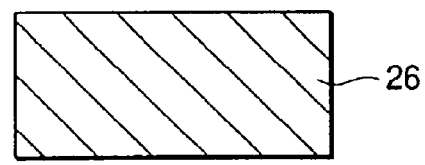
FIG. 3C1
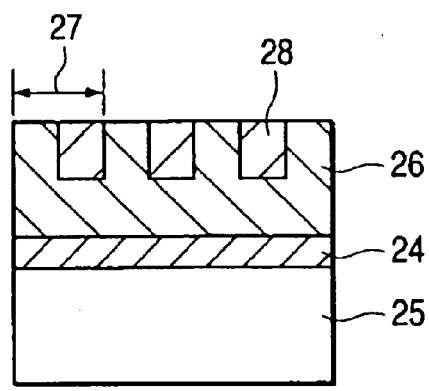
FIG. 3C2
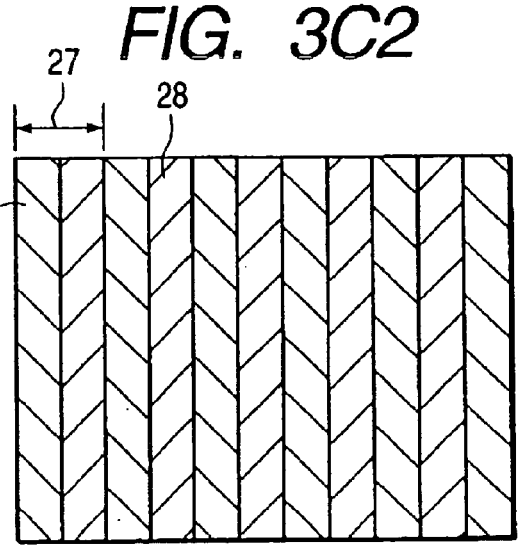

FIG. 3D1
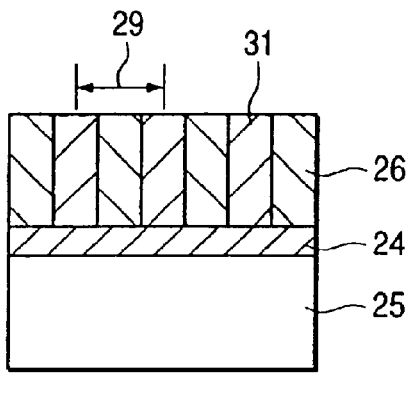
FIG. 3D2
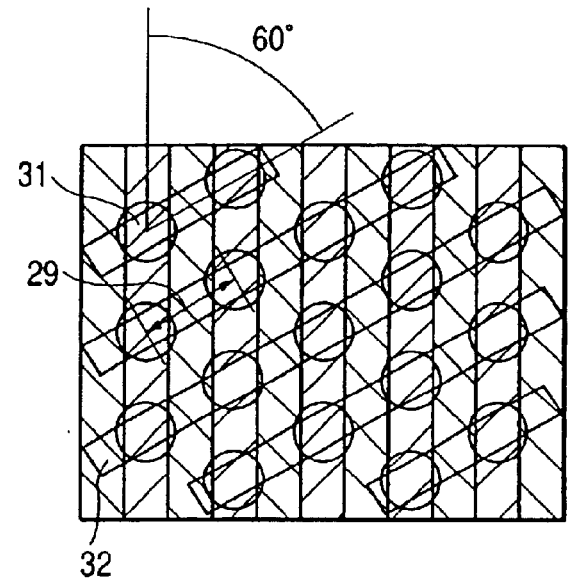
FIG. 3E1
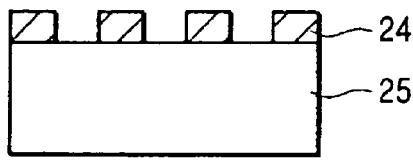
FIG. 3E2
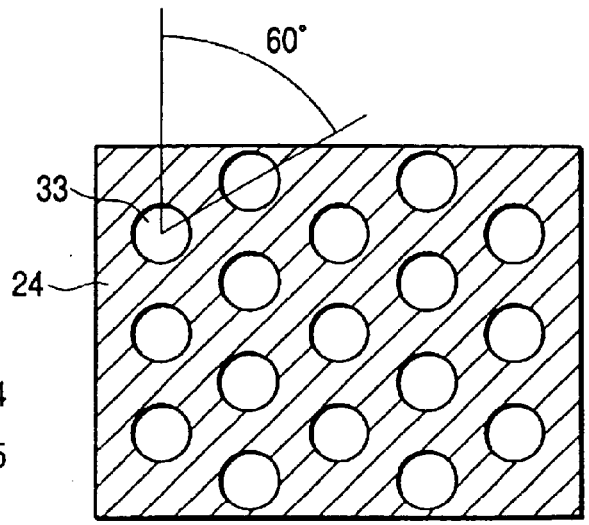

FIG. 3F1
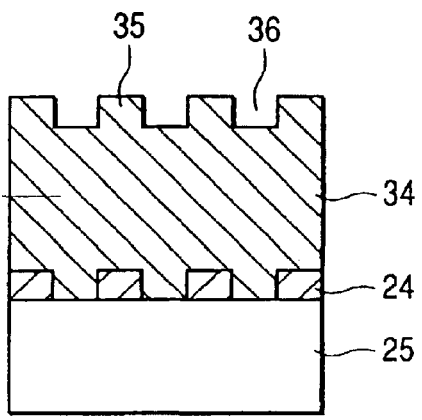
FIG. 3F2
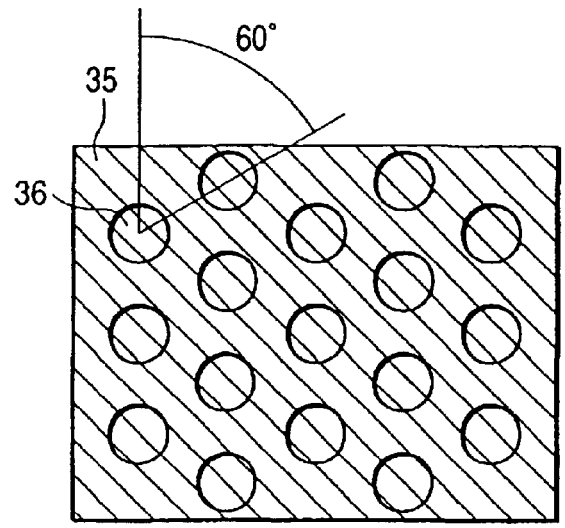
FIG. 3G1
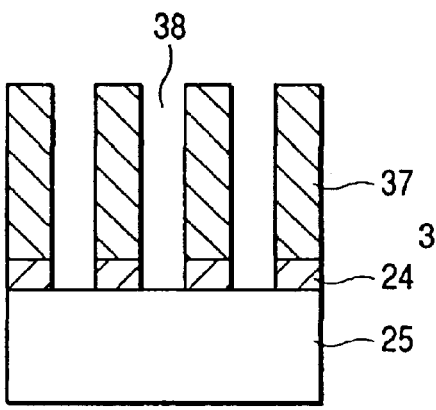
FIG. 3G2
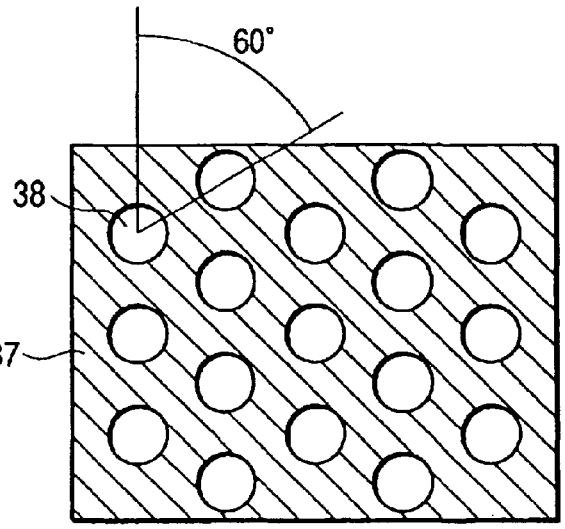

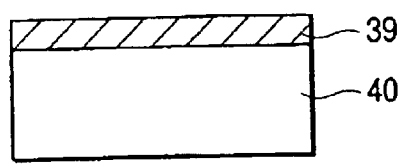
FIG. 4A1
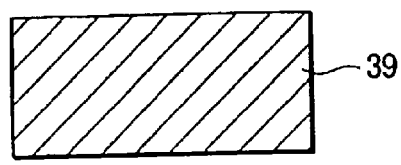
FIG. 4A2
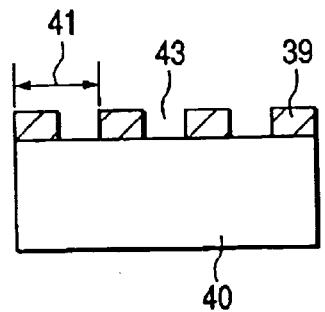
FIG. 4B1
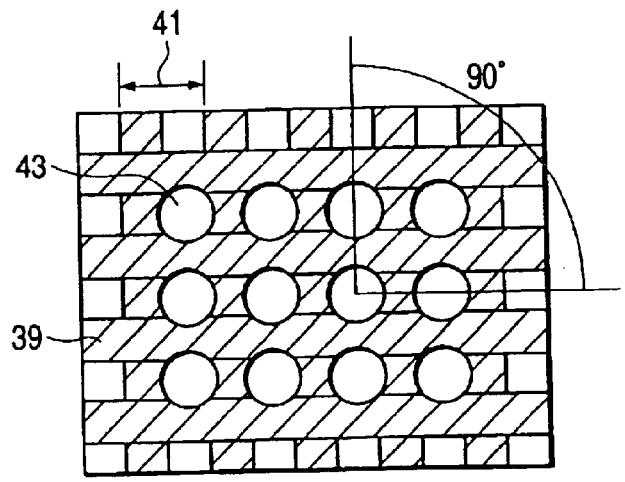
FIG. 4B2

FIG. 4C1
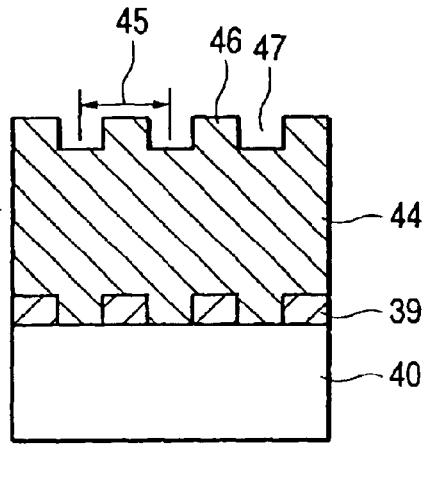
FIG. 4C2
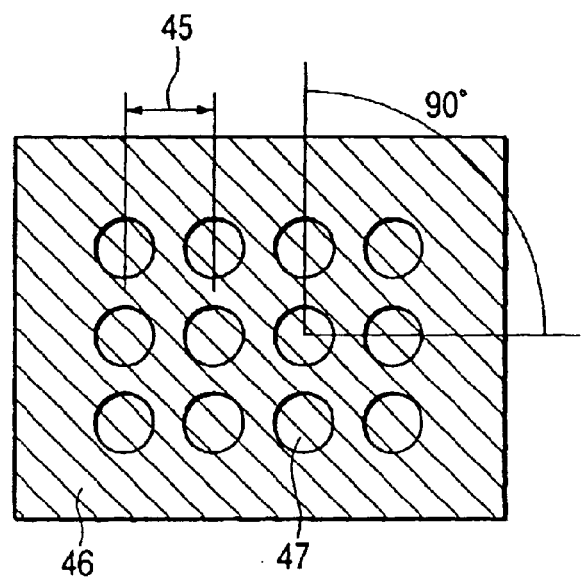
FIG. 4D1
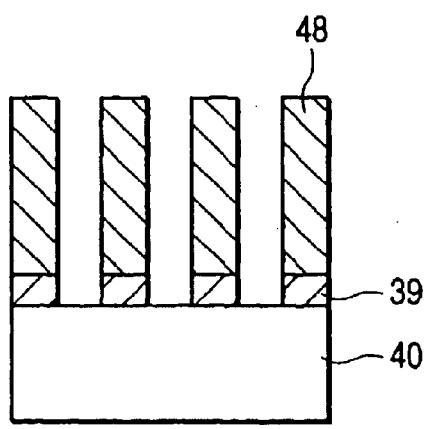
FIG. 4D2
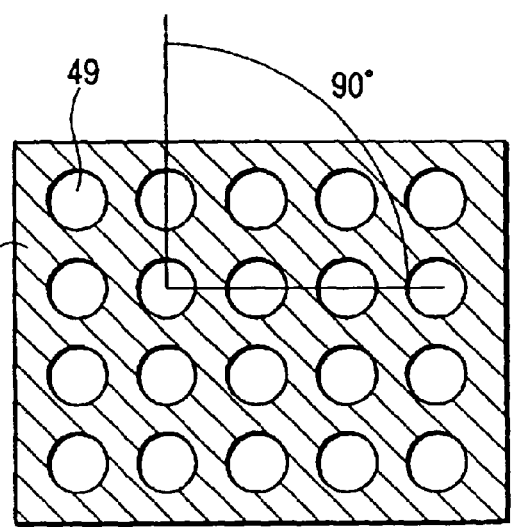

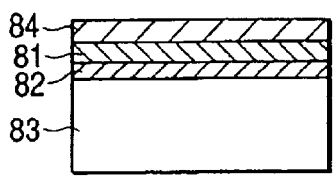# FIG. 8A1
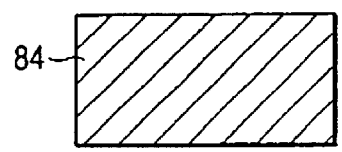# FIG. 8A2
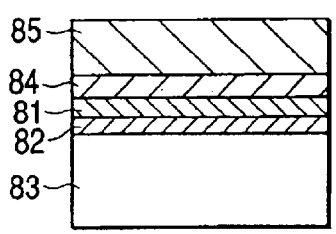# FIG. 8B1
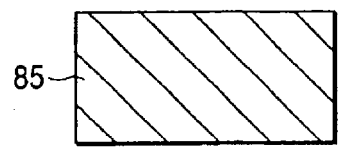# FIG. 8B2
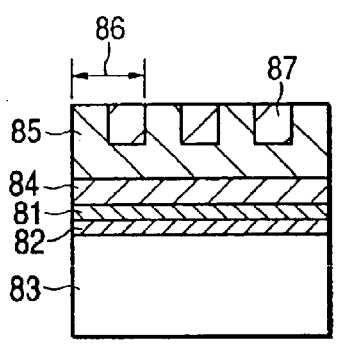# FIG. 8C1
FIG. 8C2
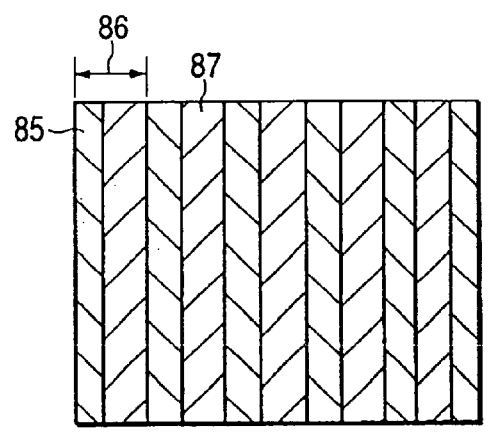
FIG. 8D2
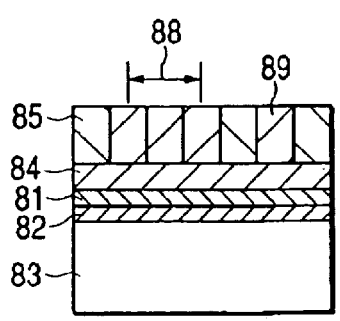# FIG. 8D1
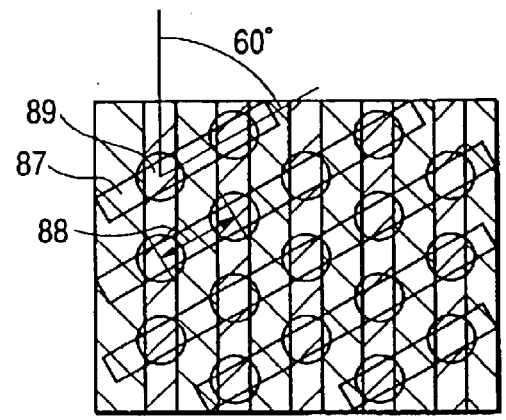

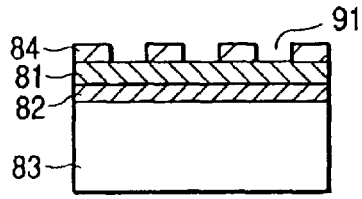
FIG. 8E1
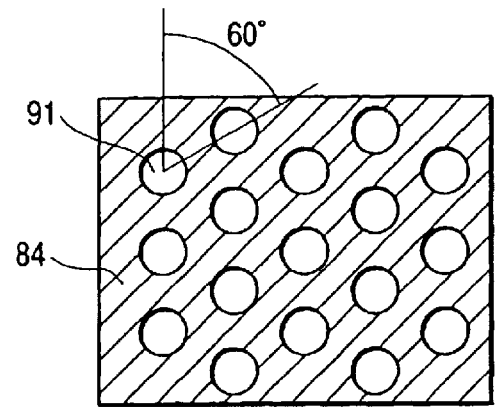
FIG. 8E2
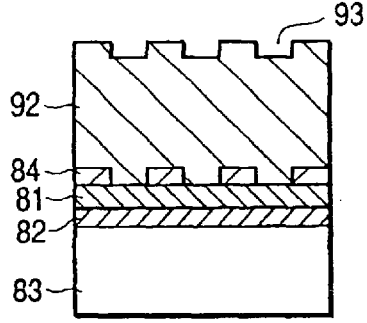
FIG. 8F1
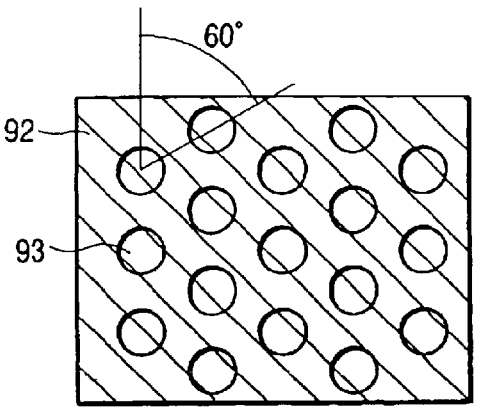
FIG. 8F2
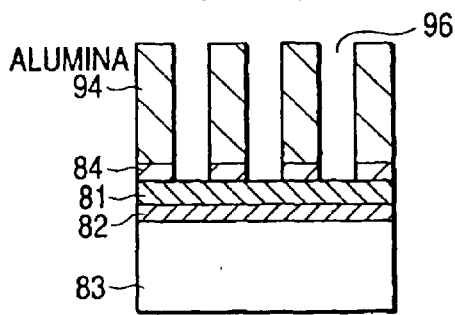
FIG. 8G1
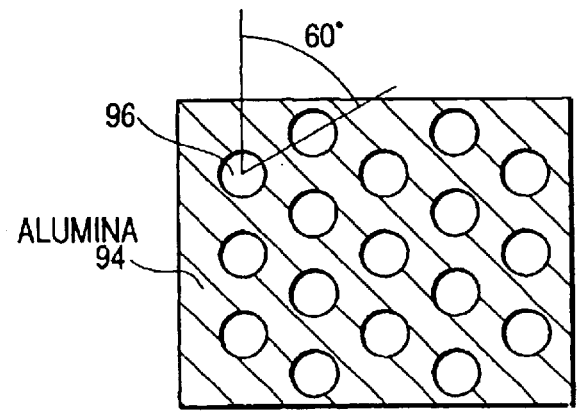
FIG. 8G2

METHOD OF MANUFACTURING A STRUCTURE HAVING PORES

This Application is a division of application Ser. No. 09/649,598, filed on Aug. 29, 2000 now U.S. Pat. No. 6,610,463, which is incorporated herein by reference.

BACKGROUND OF THE INVENTION

1. Field of the Invention

The present invention relates to a method of manufacturing a minute structure, and to a minute structure and a minute structure device manufactured by the manufacturing method. More particularly, the present invention relates to a method of manufacturing an ordered minute structure by forming a recess-projection pattern in the surface of a substrate or on the substrate by means of interference lithography, irradiation with a focused ion beam, or the like. The present invention also relates to a minute device characterized by using an orderly minute structure as a mold or a mask.

2. Related Background Art

Some thin films, wires, dots, or the like of metals and semiconductors, having a size smaller than a specific length, confine motions of electrons to exhibit a unique electrical, optical or chemical characteristic. From this point of view, there is a growing interest in minute structures of nano-sizes having a structure smaller than several hundred nanometers (also called nanostructures) as a high-performance material.

Methods for manufacturing such nanostructures include a method of directly manufacturing a nanostructure by a semiconductor processing technique, e.g., photolithography, electron beam lithography, x-ray lithography, etc. Methods of forming a very fine pattern are reported by, for example, M. C. Hutley, "Coherent Photofabrication", Optical Engineering, Vol. 15 No. 3(1976), and J. Y. Decker et al, "Generation of subquarter-micron resist structures using optical interference lithography and image reversal", J. Vac. Sci. Technol, B15(6), Nov/Dec(1997).

Besides the development of these manufacturing methods, trials have been made to realize novel nanostructures on the basis of orderly structures spontaneously formed, i.e., structures formed in a self-ordering manner.

As a method of such self-ordering, an anodizing method can be mentioned which enables easy controllable manufacture of a structure having nano-sized pores (nanoholes). For example, anodic alumina produced by anodizing Al or an Al alloy in an acid bath is known.

If an Al plate is anodized in an acid electrolyte, a porous oxide membrane is formed (see, for example, R. C. Furneaux, "The formation of controlled-porosity membranes from anodically oxidized aluminium", NATURE, Vol. 337, P147(1989), etc.). Specifically, this porous oxide membrane has a unique geometric structure in which very thin cylindrical pores (nanoholes) having a diameter of several namometers to several hundred nanometers are arrayed at intervals of several namometers to several hundred nanometers (cell size).

A method of performing two anodizing steps in order to improve the verticality, linearity and independence of such pores has been proposed. In this method, a porous oxide membrane formed by anodizing is temporarily removed and is again processed by anodizing to make a porous oxide membrane having pores (Masuda et al, "Fabrication of gold nanodot array using anodic porous alumina as an evaporation mask", Jpn. J. Appl. Phys, Vol. 35, Part 2, No. 1B, L126-L129(1996)).

Further, a method of forming pore formation start points by using a stamper in order to improve the controllability of the shape, interval and pattern of pores of a porous oxide membrane has been proposed (Japanese Patent Application Laid-Open No. 10-121292, EP-A-931859). That is, in this method, dents are formed as pore formation start points in the surface of an Al plate by pressing a substrate having a plurality of projections against the surface of the Al plate, and anodizing is thereafter performed to make a porous oxide membrane having pores. Japanese Patent Application Laid-Open No. 11-200090, and EP-A-0913850 Publication, etc. Also disclose contents relating to porous oxide membranes having pores.

Various applications of anodic alumina have been tried by considering the unique geometrical structure of anodic alumina. For example, applications to membranes utilizing the wear resistance and electric insulation of anodic oxide film, and to filters in the form of a separated membrane are known. By using a technique of filling nanoholes with a metal, a semiconductor or the like, or a nanohole replication technique, applications to coloring, magnetic recording mediums, electroluminescent elements, electrochromic elements, optical elements, solar cells, gas sensors, and other various applications are now being tried. Further, applications to quantum effect devices, such as quantum wires, and metal-insulator-metal devices, to molecule sensors using nanoholes as a chemical reaction field, and other various applications are expected (Masuda, "Highly-Ordered Nanohole-Array from Anodic Porous Alumina", Kotaibutsuri (solid state physics), Vol. 31, No. 5, 493–499(1996)).

There is a demand for a simple method for manufacturing nano-sized structures with improved reproducibility.

However, there is a limit in terms of controllability, to the improvement of methods based on ordinary anodizing and/ or there is a limit to the interval between formable pores, and the material needs to be anodized for a long time.

SUMMARY OF THE INVENTION

In view of the above-described problems of the conventional art, an object of the present invention is to provide, in a method of manufacturing a structure having pores (nanostructure) made by anodizing, techniques for making, in a simple manner, any desired array of pores having a large area in a short time at a low cost.

Another object of the present invention is to provide a novel structure and device formed on the basis of a structure having nano-sized pores made by using these techniques to enable versatile uses of structures having nano-sized holes as functional materials.

To achieve the above-described objects, according to the present invention, there is provided a method of manufacturing a structure having pores, including the steps of preparing a substrate having recesses in its surface, providing a film to be anodized on a surface of the substrate, and anodizing the film.

According to the present invention, the substrate may have a first layer, a conductive layer provided on the first layer, and a second layer provided on the conductive layer, the second layer having in its portion a through hole through which the conductive layer is exposed.

According to the present invention, the substrate may have a first layer, a conductive layer provided on the first layer, and a second layer provided on the conductive layer. The second layer may be provided in such a manner that the conductive layer is partially exposed.

According to the present invention, the step of preparing the substrate includes the step of providing the second layer.

The step of providing the second layer may include the steps of providing on the conductive layer a material to form the second layer, performing at least two steps of interference lithography to process the material provided to form the second layer, and partially exposing the conductive layer by removing a region exposed by the interference lithography. The direction of interference fringes in each of the second and other subsequent interference lithography steps is different from the direction of interference fringes in the first step of interference lithography.

According to the present invention, the step of providing the second layer may alternatively include the steps of providing on the conductive layer a material to form the second layer, performing at least two steps of interference lithography to process the material provided to form the second layer, and partially exposing the conductive layer by removing a region other than a region exposed by the interference lithography. The direction of interference fringes in each of the second and other subsequent interference lithography steps is different from the direction of interference fringes in the first step of interference lithography.

According to the present invention, the substrate having recesses in its surface may include a first layer, and a second layer provided on the surface of the first layer, the second layer having in its portion a through hole through which the first layer is exposed.

According to the present invention, the substrate having recesses in its surface may include a first layer, and a second layer provided on the first layer. The second layer may be provided in such a manner that the first layer is partially exposed.

According to the present invention, the electric conductivity of the second layer is lower than the electric conductivity of the conductive layer.

The above-described manufacturing method makes it possible to form orderly pores through a large area.

According to the manufacturing method of the present invention, recesses (pore formation start points) in the surface of the film to be anodized are formed right above recesses of a "recess-projection pattern" provided on the substrate. Therefore, when pores (nanoholes) are formed by anodizing, the pores can be formed with improved linearity.

BRIEF DESCRIPTION OF THE DRAWINGS

FIGS. 1A1, 1A2, 1B1, 1B2, 1C1, 1C2, 1D1, 1D2, 1E1, 1E2, 1F1, 1F2, 1G1 and 1G2 are diagrams showing a manufacturing method in accordance with the present invention;

FIGS. 2A1, 2A2, 2B1, 2B2, 2C1, 2C2, 2D1, 2D2, 2E1 and 2E2 are diagrams showing a manufacturing method in an embodiment of the present invention;

FIGS. 3A1, 3A2, 3B1, 3B2, 3C1, 3C2, 3D1, 3D2, 3E1, 3E2, 3F1, 3F2, 3G1 and 3G2 are diagrams showing a manufacturing method in another embodiment of the present invention;

FIGS. 4A1, 4A2, 4B1, 4B2, 4C1, 4C2, 4D1 and 4D2 are diagrams showing a manufacturing method in still another embodiment of the present invention;

FIGS. 8A1, 8A2, 8B1, 8B2, 8C1, 8C2, 8D1, 8D2, 8E1, 8E2, 8F1, 8F2, 8G1 and 8G2 are diagrams showing a manufacturing method in still another embodiment of the present invention.

DESCRIPTION OF THE PREFERRED EMBODIMENTS

Figure 5A:
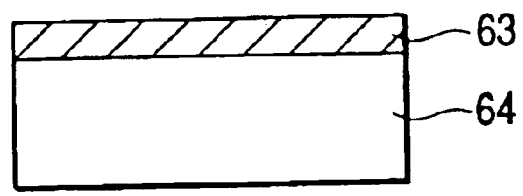
FIGS. 5A, 5B, 5C, 5D, 5E, 5F and 5G are diagrams showing a manufacturing method in still another embodiment of the present invention.
Figure 5B:
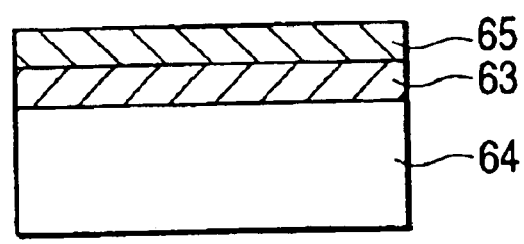
Figure 5C:
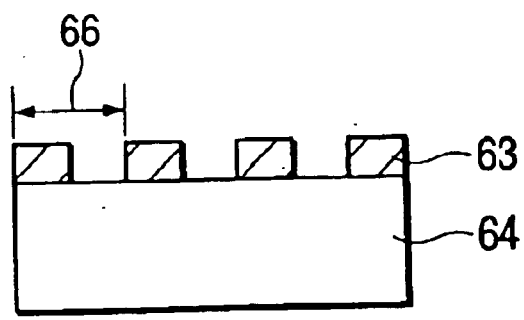

An example of a method of manufacturing a structure in accordance with the present invention will be described with reference to the accompanying drawings.

A manufacturing method of the present invention is generally divided into A: the step of preparing a substrate having recesses (projections) in its surface, B: the step of providing an object (film having Al as a main constituent) to be processed (anodized) on a surface of the substrate, and C: the step of forming pores by anodizing the object (film having Al as a main constituent) to be processed. The manufacturing method will be described in the order of the steps A to C.

Steps 1A to 1G described below represent details of the above-described steps A, B, and C, and FIGS. 1A1, 1B1, 1C1, 1D1, 1E1, 1F1 and 1G1 are diagrams corresponding to the steps 1A to 1G. FIGS. 1A2, 1B2, 1C2, 1D2, 1E2, 1F2 and 1G2 are plan views, and FIGS. 1A1 to 1G1 are corresponding cross-sectional views. A: Step of Preparing "Substrate Having Recesses (Projections) in its Surface"

As a method of forming a "substrate having recesses (projections) in its surface", a case of providing a film (second layer) on a surface of a substrate (first layer) to form recesses (projections) will be described. Needless to say, the present invention includes, as well as the method described below, a case of preparing a "substrate having recesses (projections) in its surface" by removing (etching) surface portions of a substrate.

(1A) Selection of Substrate (First Layer) . . . FIGS. 1A1 and 1A2

A substrate (first layer) 2 is prepared.

According to the present invention, an insulating substrate formed of quartz glass or any other insulating material, a semiconductor substrate formed of silicon, gallium arsenide or any other semiconductor, or a conductive substrate made of a metal or the like can be used as substrate 2.

If an insulating substrate is used as the substrate according to the present invention, it is necessary that a conductive film serving as an electrode at the time of anodizing be formed on the surface of the substate 2. In this case, "substrate (first layer)" denotes the combination of the insulating substrate and the conductive film. The conductive film may be a film of a conductive material, e.g., a valve metal, such as niobium, titanium, tungsten, or tantalum, or tin oxide doped with fluorine, copper or platinum. The above-described conductive film may be provided on the substrate surface not only in the case where the insulating substrate is used but also in a case where the above-mentioned semiconductor substrate or conductive substrate is used. Also in such a case, "substrate (first layer)" denotes the combination of the substrate and the conductive film.

Preferably, at least one or more layers of the above-described conductive film are provided.

The substrate (first layer) is not particularly specified in thickness and mechanical strength as long as pores can be formed without any problem by anodizing a below-described object (film having Al as a main constituent) 11 to be processed (anodized).

Further, as substrate 2, a substrate having a film of a valve metal such as Ti or Nb formed on its surface, or a substrate which itself is formed of a valve metal may be used. If such a substrate is used, the formation of pores in the anodizing step described below can be to be stopped at the surface of the valve metal film (the interface between the valve metal and the below-described object to be processed). The uniformity of pores in depth can be improved thereby. A substrate having a valve metal film or formed of a valve metal is therefore preferred as substrate 2.

The description will be hereinafter made with respect to a case where a silicon substrate without a conductive film is used as substrate 2.

Next, a "recess-projection pattern" having a desired configuration is formed in the surface of the substrate prepared in the above-described step 1A1.

According to the present invention, "recess-projection pattern" denotes (1) the configuration of film (second layer, i.e., projections) selectively formed so as to define areas (recesses) through which the substrate surface (the conductive film surface in the case where a conductive film is provided) is exposed at desired positions, or denotes (2) the configuration of recesses formed by removing (etching) the substrate surface (the conductive film surface in the case where a conductive film is provided on the substrate) at desired portions. Also, it may denote (3) a combination of (1) and (2), i.e., providing a film (second layer, i.e., projections) around the desired positions, and the formation of recesses by removing the substrate surface at the desired positions.

According to the present invention, with respect to the forms (1) and (3), it is preferred that the material forming the film (second layer) on the substrate surface should have an electric conductivity lower than that of the material forming the substrate surface (the conductive film surface in the case where a conductive film is provided). With respect to the forms (1) and (3), it is also preferred that the material forming the film (second layer) about the desired positions should be an insulating material. If these conditions are satisfied, pores formed by the anodizing step described below can be faced toward the regions not covered with the film (second layer) (where the surface of the conductive material constituting the substrate is exposed) without deviating into the film (second layer). Consequently, pores having improved linearity can be formed with high reproducibility.

There are various methods for forming the "recess-projection pattern" in accordance with the present invention. For example, a "recess-projection pattern" can be formed in the substrate surface by performing electron beam lithography, interference lithography, focused ion beam sputtering, or the like.

An example of a process using interference lithography to form a "recess-projection pattern" (second layer) in the above-described form (1) will be described below.

A "recess-projection pattern" in the above-described form (1) may be formed by the method of selectively arranging projections (second layer) on the substrate surface, or by the method of forming projections (second layer) by providing a film on the substrate surface and removing portions of the film. Circular recesses are preferred, but rectangular recesses or linearly-extending recesses may also be formed. The form of each recess is such that the substrate surface is exposed at the bottom of the recess, and the exposed area is surrounded by the second layer (projection). However, it is not always necessary for the exposed area to be completely surrounded by the second layer. That is, a plurality of linearly-extending second layers (projections) may be formed in an array. If second layers (projections) are linearly formed in this manner, it is preferred that the respective thicknesses of the second layers (projections) are substantially equal to each other.

The material of a film used to form a "recess-projection pattern" (second layer) in the above-described form (1) or (3) is, for example, a positive resist, or a negative resist, and may be selected from other various materials. $SiO_2$ is used in the process described below.

The material of sacrifice layer used to form a "recess-projection pattern" (second layer) in the above-described from (1) or (3) is, for example, ultra violet rays high-resolution resist used for photolithography. A resist may be selected from a positive resist, or a negative resist, and may be selected from other various formations. A positive resist is used in the process described below.

A "recess-projection pattern" (a recess-array pattern, in particular) in accordance with the present invention may be selected from a honeycomb pattern, a grid pattern, a delta pattern, etc. A honeycomb "recess-projection pattern" is formed in the process described below.

First, $SiO_2$ film 1 used as a matrix for such a "recess-projection pattern" (second layer) is formed on the Si substrate 2 prepared in the above-described step 1A (see FIG. 1A1 and FIG. 1A2).

(1B) Step of Providing Mask Material for Forming "Recess-Projection Pattern" (Second Layer)

Next, a resist (sacrifice layer) 3 is provided on the $SiO_2$ film 1 (FIG. 1B1 and FIG. 1B2). Preferably, the substrate surface provided with the $SiO_2$ film on the substrate is previously treated in a cleaning step including ultrasonic cleaning using acetone for 10 minutes and isopropyl alcohol (IPA) for 10 minutes, and drying at 120° C. for 20 minutes or more in a clean oven or the like.

The resist (sacrifice layer) 3 is not limited to a particular one, but an i-line compatible high-resolution positive resist and an i-line compatible high-resolution negative resist are usable. In the described process, a positive resist AZ5214E produced by Clariant Japan was used by being diluted with a resist thinner liquid.

Preferably, before application of the resist, a surface treatment agent for controlling the wettability (surface energy) of the surface of the $SiO_2$ film with the resist to be applied is provided on the $SiO_2$ film surface. It is also preferable to provide a reflection control film for limiting reflection at the interface between the resist and the $SiO_2$ film in order to obtain pores having a high aspect ratio by the anodizing step described below.

The above-mentioned surface treatment agent is, for example, hexamethyldisilazane (HMDS).

The above-mentioned reflection control film is, for example, an organic film capable of reducing reflected light at the interface, or an organic film in which a dye is mixed. As a material for forming the above-mentioned organic film, polysulfone, polyamide, polyimide, polymethacrylic acid, polymethyl methacrylate, polymethacrylamide, or the like is preferably used. As the above-mentioned dye, curcumin or cumarin, for example, can be used.

The above-mentioned reflection control film is advantageously used if the reflectivity of the object to be processed ($SiO_2$ film 1 in this case) is high, and is effective in reducing exposure unevenness by limiting interference in the resist film.

Next, patterning of the resist 3 is performed (FIGS. 1C1, 1C2, 1D1 and 1D2). In this example, interference lithography with two times exposure is used as the patterning method.

An example of performing exposure two times to resist will be described below. Needless to say, the patterning method is not limited to this method.

(1C) First Exposure . . . FIGS. 1C1 and 1C2

The first exposure is performed in such a manner that the resist layer 3 is exposed to light in the form of a plurality of lines to have stripe-like exposed regions, as shown in FIG. 1C2. A reference numeral 4 designates the exposure period (interval) of the stripe-like exposed regions 5, and a reference numeral 5 designates exposed resist portions (first time).

An arbitrary type of laser, e.g., excimer laser, He-Cd laser, or Ar laser can be used as a light source for the interference lithography. In this example, He-Cd laser (wavelength: 325 nm, TEM00 mode) was used. Theoretically, the interval of the pattern formed by interference lithography can be reduced to the distance corresponding to half the wavelength. Therefore, if a finer structure is required, a laser of a shorter wavelength is preferably used, although the kind of laser employed is not particularly limited. Also, a stabilized output and a laser quality called TEM00 mode are preferred.

(1D) Second Exposure . . . FIGS. 1D1 and 1D2

The second exposure is thereafter performed (FIGS. 1D1 and 1D2).

The second exposure is performed by irradiation with light in the form of a plurality of lines which intersect the longitudinal axes of the linearly extending regions 5 exposed by the first exposure (forming an angle of 60° C. or 90° C., for example). The second exposure is thus performed to define intersection portions 8 corresponding to the points of intersection of the interference fringes in the different directions.

Then, development is performed so as to remove the strongly exposed portions 8. By this development, a mask for forming a "recess-projection pattern" (second layer) described below is formed. In FIGS. 1D1 and 1D2, a reference numeral 6 designates an interval between strongly exposed regions 8, and a reference numeral 7 designates the angle formed between the direction of the first exposure and the direction of the second exposure. The angle is 60°, in this example. In the formation of pores by anodizing, pores tend to form themselves by self-ordering on such a pattern that a shape similar to a regular hexagon appears recurrently. Therefore, it is preferable to form a "recess-projection pattern" (recesses, in particular) such that a shape similar to a regular hexagon (the shape of a honeycomb cell) appears recurrently. This is particularly desirable in a case of stably forming a nanostructure having deep pores.

In the formation of pores by anodizing, the intervals between the pores can be controlled to some degree through the setting of process conditions, i.e., the kind, concentration and temperature of an electrolytic solution used for anodizing, the method of applying an anodizing potential, the potential value, time, etc. Accordingly, it is preferable to design a "recess-projection pattern" (recesses, in particular) with pore intervals presupposed from the process conditions.

The development method in this process was such that development using a developer diluted with pure water in the ratio 1:1 was performed for about 60 seconds, thereby removing the resist in the exposed regions. Openings (FIG. 1D2) formed through the resist layer to reach the $SiO_2$ film 1 surface were thereby formed.

(1E) "Recess-Projection Pattern" (Recesses) Forming Step . . . FIGS. 1E1 and 1E2

The $SiO_2$ film 1 was etched with the mask formed by the resist 3 having the openings obtained by the above-described development, thereby forming recesses 10 through which the substrate surface is exposed. In this step, a "recess-projection pattern" (second layer) 1 is formed (FIGS. 1E1 and 1E2). In this step, portions of the substrate surface are exposed as described above to ensure a connection between a film having Al as a main constituent (an object to be processed), provided afterward, and the Si substrate.

The regions (intersection portions) 8 (FIGS. 1D1 and 1D2) subject to the first exposure and to the second exposure have been removed by the above-described development step. Therefore, the regions of the surface of the Si substrate corresponding to the intersection portions 8 are exposed and the openings (recesses) 10 are formed by etching.

The above-described etching was performed by plasma etching process using CF4 at 200 W for 3 minutes. It is desirable to perform etching at a high pressure in order to form vertical holes having a high aspect ratio.

In this process, patterning of the resist 3 was performed to form the openings (recesses) 10 in the film 1 (FIG. 1E1). However, a process may be used which does not use the above-described $SiO_2$ film 1, and which is performed in such a manner that, as shown in FIGS. 4A1 to 4D1 and 4A2 to 4D2, a layer of a resist 39 having openings (recesses) 43, through which the substrate surface is exposed, is directly formed on the substrate surface to be used as a "recess-projection pattern" (second layer).

B: Step of Providing Object to be processed on Substrate Surface (1F) Formation of Film of Object to be processed . . . FIGS. 1F1 and 1F2

A film of an object 11 to be processed (film to be anodized) is provided on the above-described "recess-projection pattern" ($SiO_2$ film (projections) 1 and on the $SiO_2$ substrate 2 exposed through the above-described openings (recesses) 10 (FIGS. 1F1 and 1F2).

A compound having Al as a main constituent may be preferably provided as a material forming the object to be processed. However, the kind of material forming the object to be processed is not particularly limited as long as pores can be formed by anodizing. In this process, a film having Al as a main constituent was used as a film of object 11 to be processed (film to be anodized).

The film of object 11 to be processed (film having Al as a main constituent) can be formed by an arbitrary film forming method, e.g., resistor heating deposition, electron beam deposition, sputtering, chemical vapor deposition (CVD), or plating.

As a result, in the surface of the film (object to be processed) 11 having Al as a main constituent, recesses 12 are formed right above the openings (recesses) 10 of the above-described "recess-projection pattern", as shown in FIGS. 1F1 and 1F2.

C: Step of Anodizing Object to be processed (1G) Performing Anodizing . . . FIGS. 1G1 and 1G2

The film of above-described object 11 to be processed is anodized to make a nano-sized structure (nanostructure) having pores (FIG. 1G1).

In this step, pores 14 are selectively formed right above the recesses (openings) 10 of the above-described "recess-projection pattern" (second layer). As already described above, it is preferable that the material forming the projections (film 1) constituting the "recess-projection pattern" (second layer) should have an electric conductivity lower than that of the material forming the substrate surface (the conductive film surface in the case where a conductive film is provided). Further, it is preferable that the material constituting the projections be an insulating material. In this process, therefore, $SiO_2$ was used as the material constituting the projections (second layer). If these conditions are satisfied, pores formed by the anodizing step can be faced toward the regions not covered with the film (second layer) (where the surface of the conductive material constituting the substrate is exposed) without deviating into the film ($SiO_2$)1. Consequently, pores having improved linearity can be formed substantially in parallel with each other with high reproducibility.

The electrolytic solution used for anodizing is, for example, a solution of oxalic acid, phosphoric acid, sulfuric acid, or chromic acid. It is not limited to a particular kind as long as pores can be formed by anodizing without a problem. The anodizing potential, temperature, and other anodizing conditions according to the respective electrolytic solution can be set as desired with respect to the nanostructure to be made.

The structure having pores, formed by the above-described anodizing, may be processed by pore-widening, such that it is immersed in an acid solution (e.g., a phosphoric acid solution in the case of anodic alumina) to increase the diameter of the pores as desired.

Finally, the structure 100 having pores formed therein (FIG. 1G1) is cleaned by running ultrapure water. In FIGS. 1G1 and 1G2, alumina formed from the above-described film 11 having Al as a main constituent by anodizing is indicated at 13, and a pore formed by anodizing is indicated at 14.

The structure 100 made by the manufacturing method of the present invention has pores formed into the desired shape and arrayed in order.

In the manufacturing method of the present invention, an interference lithography is specifically used to make the desired structure having a large area in a short time at a low cost.

(Embodiments)

Embodiments of the present invention will now be described below specifically.

Embodiment 1

FIGS. 2A1, 2B1, 2C1, 2D1 and 2E1 are schematic cross-sectional views of each step in Embodiment 1, and FIGS. 2A2, 2B2, 2C2, 2D2 and 2E2 are corresponding plan views. In this embodiment, the surface of a substrate (16) is partially removed to form a "recess-projection pattern", and Al film deposited on the pattern is anodized to form pores. This embodiment will be described below with reference to FIGS. 2A1 to 2E1 and 2A2 to 2E2.

(1) The n-Si substrate (16) is cleaned by acetone and IPA and is dried. Then, a material for forming a positive resist film (15) (film thickness: 200 nm) is applied to the substrate by spin coating and is dried (90° C., 20 minutes).

(2) A "recess-projection pattern" having a periodic structure (intervals: 230 nm) (17) like a striped pattern is formed in the resist layer by using interference lithography. More specifically, lithography is performed to an irradiation amount of 29.5 mJ/cm² by using He-Cd laser (λ=325 nm, interference fringe interval: 230 nm). Development using a developer diluted with pure water in the ratio 1:1 is performed for about 30 seconds to form a striped orderly "recess-projection pattern" to reach the n-Si substrate surface (see FIGS. 2A1 and 2B1).

(3) The exposed Si substrate is etched by using as a mask the resist 15 pattern formed in the preceding step, and the remaining resist is removed (FIGS. 2C1 and 2C2). Etching was performed by plasma etching process using CF4 at 1.2 Pa and 200 W for 3 minutes. In FIGS. 2C1 and 2C2, a projection formed in the n-Si substrate surface is indicated at 18, and a recess formed in the n-Si substrate surface is indicated at 19.

(4) Al film (film thickness: 500 nm) (20, 21) is then formed on the n-Si substrate surface. Recesses and Projections reflecting the recesses and projections formed in the n-type Si substrate surface were formed in the surface of the object to be processed, formed of Al (FIGS. 2D1 and 2D2). In FIGS. 2D1 and 2D2, a projection formed in the Al film surface is indicated at 20, and a recess formed in the Al film surface is indicated at 21.

(5) Thereafter, anodizing was performed at 100 V in a 0.3 M phosphoric acid solution to change the Al film into alumina (22) by oxidization. As a result, a structure was obtained which had pores (23), which started forming from the recesses 21 in the Al film surface toward the recesses formed in the substrate surface (see FIGS. 2E1 and 2E2).

(6) Finally, the structure having pores was immersed in a 5 wt % phosphoric acid solution for 30 minutes to enlarge the diameter of the pores.

<Evaluation>

The nano-sized structure made by the above-described process was observed with a field-emission scanning electron microscope (FESEM). It was thereby confirmed that cylindrical pores (23) having a pore interval of about 266 nm and a pore diameter of about 100 nm were arrayed corresponding to the recesses formed in the resist at intervals of 230 nm.

Embodiment 2

FIGS. 3A1, 3B1, 3C1, 3D1, 3E1, 3F1 and 3G1 are schematic cross-sectional views of each step in Embodiment 2, and FIGS. 3A2, 3B2, 3C2, 3D2, 3E2, 3F2 and 3G2 are corresponding plan views.

This embodiment will be described with reference to FIGS. 3A1 to 3G1 and 3A2 to 3G2.

(1) An n-Si substrate (25) was cleaned by acetone and IPA and was dried. Then, a material for forming a reflection control film (24) (film thickness: 100 nm) and a material for forming a positive resist film (26) (film thickness: 200 nm) were applied to the substrate by spin coating and were dried (90° C., 20 minutes) (see FIGS. 3A1 and 3B1. In this embodiment, AZBARi-100, a product from Clariant Japan was used as a material for forming the reflection control film.

(2) A "recess-projection pattern" formed by the resist as a honeycomb pattern was then formed by the same lithography method as the above-described laser interference exposure.

In this embodiment, first lithography was performed to an irradiation amount of 29.5 mJ/cm² by using He-Cd laser (λ=325 nm, interference fringe interval: 230 nm), thereby forming stripe-like-exposed regions 28 of the resist 26 (FIGS. 3C1 and 3C2).

Next, second lithography was performed to an irradiation amount of 29.5 mJ/cm² by changing the direction of interference fringes by an angle of 60° from the direction of interference fringes used in the first interference lithography step, thereby forming stripe-like exposed regions 32 of the resist 26 (FIGS. 3D1 and 3D2).

Thereafter, development is performed for about 60 seconds by using a developer diluted with pure water in the ratio 1:1, thereby selectively removing regions (intersection portions) 31 exposed by the first lithography and the second lithography. By this step, an orderly "recess-projection pattern" having recesses (openings) hollowed in portions of the resist to the surface of the reflection control film 24. The periodic interval between the stripe-like regions (exposure period) (27) is 230 nm, and the periodic interval (pore interval) (29) of the exposure intersection portions (31) is (2/√3)×230=266 nm (see FIGS. 3C1 and 3D1).

(3) Next, the layers on the substrate including the remaining resist 26 are etched to form a "recess-projection pattern" 24 (FIGS. 3E1 and 3E2). Etching is performed by plasma etching process using Ar at 1.2 Pa and 200 W for 4 minutes. By this step, the remaining resist is removed substantially completely, and the regions of the reflection control film 24 corresponding to the resist openings are etched to expose the surface of substrate 25 (see FIG. 3E1).

(4) Next, Al film (film thickness: 500 nm) (34) is formed. Recesses and projections reflecting the structure of the "recess-projection pattern" formed in the above-described step are formed in the surface of the object 34 to be processed of the Al film(see FIG. 3F1).

(5) Thereafter, anodizing is performed at 130 V in a phosphoric acid 0.3 M solution. By this step, as shown in FIG. 3G1, pores were formed toward the exposed substrate 25 starting from recesses 36 in the Al film surface.

(6) Finally, pore widening process for increasing the diameter of the pores is performed by immersing the structure in a 5 wt % phosphoric acid solution for 30 minutes, thereby obtaining pores 38 packed orderly and densely.

<Evaluation>

The nanostructure made by the above-described process was observed with the FESEM. It was thereby confirmed that truly round pores (38) orderly arrayed hexagonally and having a pore interval (29) of about 266 nm and a pore diameter of about 100 nm were formed.

Embodiment 3

FIGS. 4A1, 4B1, 4C1 and 4D1 are schematic cross-sectional views of each step in Embodiment 3, and FIGS. 4A2, 4B2, 4C2 and 4D2 are corresponding schematic plan views. In this embodiment, a tetragonally-arrayed orderly "recess-projection pattern" is formed. A tetragonal array referred to herein is an array in which pores are arranged at positions corresponding to vertices of squares, as shown in FIG. 4C2.

The process in this embodiment will be described below.

(1) First, an n-Si substrate (40) is cleaned by acetone and IPA and is dried. Then, a material for forming a negative resist film (39) (film thickness: 200 nm) is applied to the surface of the substrate 40 by spin coating and is dried (90° C., 20 minutes) (see FIG. 4A1).

(2) Next, a "recess-projection pattern" formed by the resist so as to have recesses orderly arrayed tetragonally is made based on the above-described interference lithography method.

In this embodiment, first lithography is performed to an irradiation amount of 29.5 mJ/cm$^2$ by using He—Cd laser ($\lambda$=325 nm, interference fringe interval: 230 nm). Second lithography is performed to an irradiation amount of 29.5 mJ/cm$^2$ by changing the direction of interference fringes by an angle of 90° from the direction of interference fringes used in the first interference lithography step, as shown in FIG. 4B2. Thereafter, development is performed for about 30 seconds by using a developer diluted with pure water in the ratio 1:1. Portions (39) of the resist at the exposure intersection points are thereby formed so as to project, and the portions (43) not exposed are removed to form recesses. As a result, an orderly "recess-projection pattern" having recesses through which the substrate surface is exposed is formed (FIG. 4B2). The periodic interval between the stripe-like regions (exposure period) (41) is 230 nm, and the periodic interval of the exposure intersection portions is 230 nm.

(3) Al film (film thickness: 500 nm) (44) is formed. Recesses (47) and projections (46) reflecting the structure of the above-described "recess-projection pattern" are formed in the surface of the object to be processed (Al film) (see FIG. 4C1).

(4) Anodizing is performed at 130 V in a phosphoric acid 0.3 M solution. By this step, as shown in FIG. 4D1, pores were formed toward the exposed surface of the substrate 25 starting from recesses 36 in the Al film surface.

(5) Finally, pore widening process for increasing the diameter of the pores is performed by immersing the structure in a 5 wt % phosphoric acid solution for 30 minutes.

<Evaluation>

The nanostructure made by the above-described process was observed with the FESEM. It was thereby confirmed that cylindrical pores (49) orderly arrayed tetragonally and having a pore interval of about 230 nm and a pore diameter of about 100 nm were formed.

Embodiment 4

FIGS. 5A to 5G are diagrams showing steps of a manufacturing method in which a magnetic material (Co) is embedded in a nanostructure having orderly pores.

(1) First, SiO$_2$ film (63) was formed on the surface of Si substrate 64. Then, a step of making on the SiO$_2$ film a "recess-projection pattern" formed of a resist and having a periodic structure, and an etching steps were performed (see FIGS. 5B and 5C), as were those in the above-described embodiments.

Figure 5D:
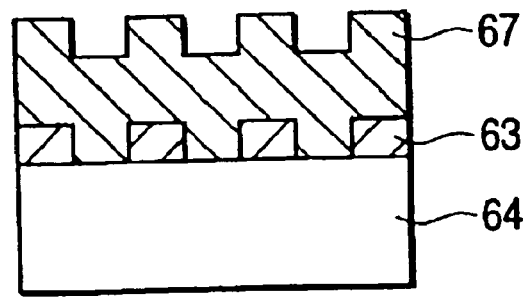

(2) Next, Al film (67) (500 nm) was formed (see FIG. 5D).

(3) Anodizing is then performed at 130 V in a phosphoric acid 0.3 M solution. Anodizing is terminated with a reduction in the current value in the current profile. By this step, as shown in FIGS. 5D and 5E, pores were formed toward the exposed surface of the substrate 64 starting from recesses in the Al film surface.

Figure 5E:
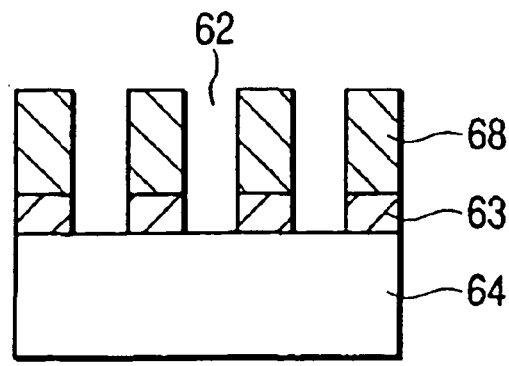

(4) Pore widening process for increasing the diameter of the pores is performed by immersing the structure in a 5 wt % phosphoric acid solution for 30 minutes (see FIG. 5E).

Figure 5F:
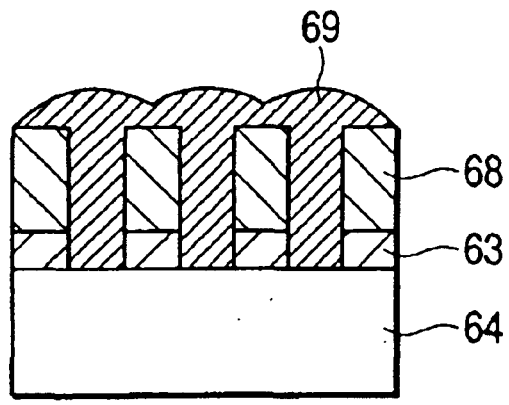

(5) Thereafter, the structure is immersed in a Co electrodeposition liquid to cause electrodeposition of Co and applied a potential to the structure in this electrolyte (see FIG. 5F). By this step, the pores 62 are filled with Co.

Figure 5G:
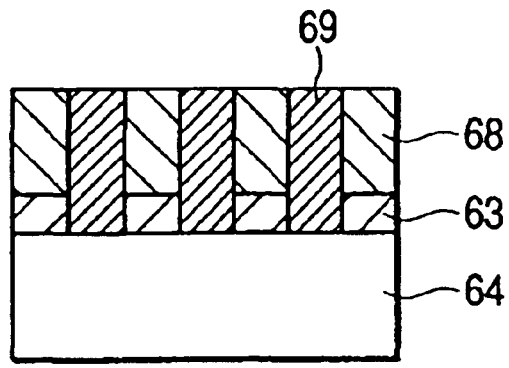

(6) Finally, surface polishing is performed by using a diamond slurry having a particle size of 500 Å to flatten the surface (see FIG. 5G).

<Evaluation>

The nanostructure made by the above-described process was observed with the FESEM. It was thereby confirmed that cylindrical pores orderly arrayed so as to have a honeycomb pattern and having a pore interval of about 266 nm and a pore diameter of about 100 nm were uniformly filled with Co.

Embodiment 5

FIGS. 6A to 6D are diagrams showing steps of a method of forming pores by using a stamper.

Figure 6A:
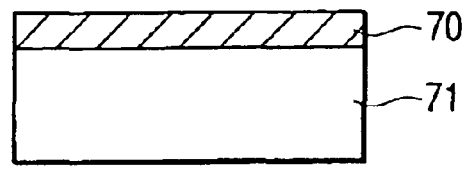
FIGS. 6A, 6B, 6C and 6D are diagrams showing a manufacturing method in still another embodiment of the present invention.

(1) Cu film (70) was formed on n-Si substrate (71) (see FIG. 6A).

Figure 6B:
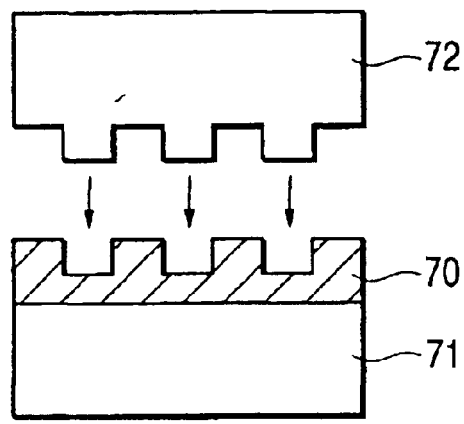
Figure 6C:
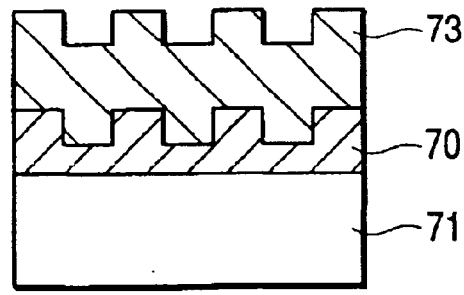

(2) A stamper (72) having dots formed thereon was placed on the Cu film and was pressed on the same at a pressure of 4.0×10$^8$ Pa (4 tons/cm$^2$) by using a hydraulic press, thereby forming dents in the Cu film (see FIG. 6B).

(3) Al film (film thickness: 500 nm) (73) is formed. Recesses and projections are formed in the surface of the object to be processed, according to the structure of the lower mask (see FIG. 6C).

Figure 6D:
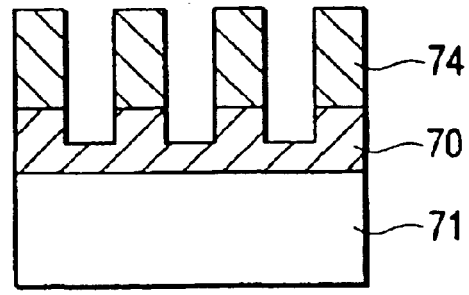

(4) Anodizing is performed at 130 V in a phosphoric acid 0.3 M solution (see FIG. 6D).

(5) Finally, pore widening process was performed by immersing the structure in a 5 wt % phosphoric acid solution for 30 minutes, thereby obtaining pores orderly arrayed so as to have a honeycomb pattern.

<Evaluation>

The nanostructure made by the above-described process was observed with the FESEM. It was thereby confirmed that cylindrical pores orderly arrayed so as to have a honeycomb pattern were formed.

Embodiment 6

FIGS. 7A to 7D are diagrams showing steps of a method of forming pores by using a focused ion beam (FIB).

Figure 7A:
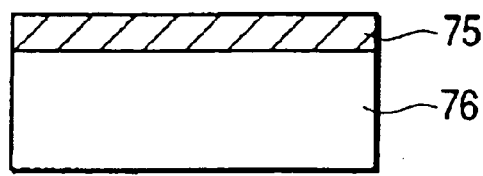
FIGS. 7A, 7B, 7C and 7D are diagrams showing a manufacturing method in still another embodiment of the present invention.

(1) Nb film (75) is formed on n-Si substrate (76) (see FIG. 7A).

Figure 7B:
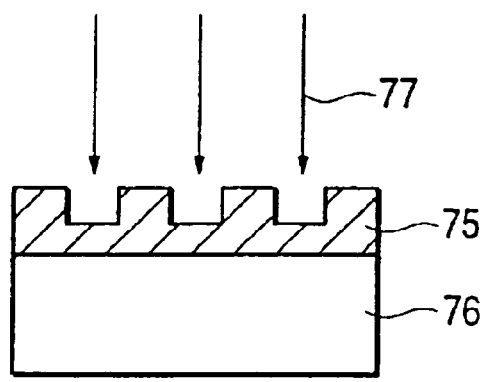

(2) Nb film 75 was irradiated with a focused ion beam (77) by using a focused ion beam processing apparatus. The kind of ions used in the focused ion beam processing apparatus is Ga, and the accelerating voltage is 30 kV. A "recess-projection pattern" having recesses so as to form a honeycomb pattern was formed. In this embodiment, predetermined regions of Nb film were etched by FIB processing to form the recesses, but the surface of the substrate 76 was not exposed (FIG. 7B).

(3) Al film (film thickness: 500 nm) (78) is formed. Recesses and projections are formed in the surface of the Al film, reflecting the recesses and projections of the above-described "recess-projection pattern" (see FIG. 7C).

Figure 7C:
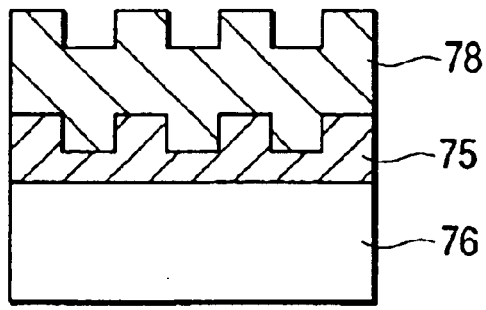
Figure 7D:
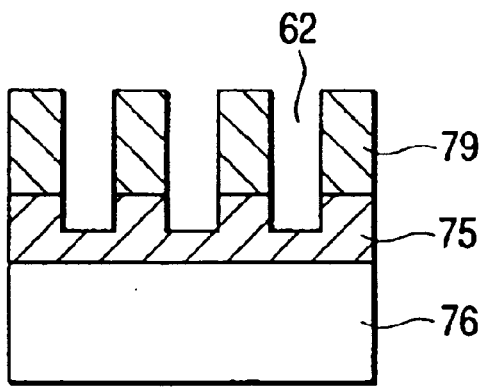

(4) Anodizing is performed at 130 V in a phosphoric acid 0.3 M solution. By this step, as shown in FIGS. 7C and 7D, pores were formed toward the recesses in the Nb film starting from recesses in the Al film surface.

(5) Finally, pore widening process is performed by immersing the structure in a 5 wt % phosphoric acid solution for 30 minutes, thereby obtaining pores 62 orderly arrayed so as to have a honeycomb pattern.

<Evaluation>

The nanostructure made by the above-described process was observed with the FESEM. It was thereby confirmed that cylindrical pores orderly arrayed so as to have a honeycomb pattern and having a pore interval of about 100 nm and pore diameter of about 50 nm were formed. The formation of the pores 62 formed in this embodiment was stopped at the recess surface of the Nb film 75, and the depth uniformity of the pores was high.

In this embodiment, conductive film 75 was provided on substrate 76 and portions of conductive film 75 are removed to form a "recess-projection pattern". However, the arrangement may be such that portions of substrate 76 are removed and the conductive film is provided on the surface of the substrate to form a "recess-projection pattern". In such a case, it is necessary to provide the conductive film so as not to fill the recesses formed in the substrate 76 surface.

Embodiment 7

FIGS. 8A1, 8B1, 8C1, 8D1, 8E1, 8F1 and 8G1 are schematic cross-sectional views of steps in Embodiment 7, and FIGS. 8A2, 8B2, 8C2, 8D2, 8E2, 8F2 and 8G2 are corresponding schematic plan views. The manufacturing process of this embodiment will be described below.

(1) First, layers of titanium (82), copper (81) and SiO$_2$ film (84) are formed on a surface of a glass substrate (83) (see FIG. 8A1).

(2) A positive resist material is applied by spin coating and is dried (90° C., 20 minutes) to form a resist film (85) (film thickness: 200 nm) (see FIG. 8B1).

(3) Thereafter, a "recess-projection pattern" formed by the resist and having recesses in a honeycomb pattern was formed by using interference lithography in the same manner as in Embodiment 2. First lithography is performed to an irradiation amount of 29.5 mJ/cm$^2$ by using He-Cd laser (λ325 nm, interference fringe interval: 230 nm), thereby forming stripe-like exposed regions 87 of the resist (FIG. 8C2). Second lithography is performed to an irradiation amount of 29.5 mJ/cm$^2$ by changing the direction of interference fringes by an angle of 60° from the direction of interference fringes used in the first interference lithography step (FIG. 8D2).

(4) Thereafter, development is performed for about 60 seconds by using a developer diluted with pure water in the ratio 1:1, thereby removing exposure intersection portions 89 to form an orderly "recess-projection pattern" having recesses (openings) hollowed to the surface of the SiO$_2$ film 84. The periodic interval (88) between the stripe-like regions (86) is 230 nm, and the periodic interval of the exposure intersection portions is (2/√3)×230=266 nm (see FIGS. 8C1 and 8D1).

(5) Next, SiO$_2$ film 84 is etched by using the above-described "recess-projection pattern" as masks (FIGS. 8E1 and 8E2). By this step, the SiO$_2$ film exposed through the openings (recesses) of the resist are etched and removed, thereby forming a "recess-projection pattern" formed by SiO$_2$. Etching was performed by plasma etching process using CF4 at 1.2 Pa and 200 W for 3 minutes, followed by cleaning using acetone. The remaining resist was thereby completely removed.

(6) Al film (film thickness: 500 nm) (92) is thereafter formed. Recesses and projections reflecting the recesses and projections of the "recess-projection pattern" formed of SiO$_2$ are formed in the surface of the Al film, i.e., the object to be processed (see FIGS. 8F1 and 8F2).

(7) Anodizing was then performed at 100V in a phosphoric acid 0.3 M solution. By this step, as shown in FIGS. 8G1 and 8G2, pores 96 were formed toward the exposed Cu film 81 (openings (recesses) formed in SiO$_2$ film 84) starting from the recesses in the Al film 92 surface.

(8) Finally, pore widening process for increasing the diameter of the pores was performed by immersing the structure in a 5 wt % phosphoric acid solution for 30 minutes, thereby obtaining orderly pores (96).

<Evaluation>

The nanostructure made by the above-described process was observed with the FESEM. It was thereby confirmed that cylindrical pores (96) having a cell size of about 266 nm and a pore diameter of about 100 nm were formed and arrayed at a high density corresponding to the recesses of the interference fringes at intervals of 230 nm.

As described above, the present invention has the advantages described below.

(1) The minute structure manufacturing method of the present invention enables a nanostructure having a large area and a high aspect ratio to be easily manufactured at a low cost in a short time.

(2) The minute structure manufacturing method of the present invention makes it possible to array pore formation start points as desired and to also array pores as desired by controlling a recess-projection pattern formed on a substrate.

(3) According to the minute structure manufacturing method of the present invention, recesses on a substrate and pore formation start points on an object to be processed are formed in alignment with each other. Therefore, linear alumina nanoholes can be made.

(4) According to the minute structure manufacturing method of the present invention, a recess-projection pattern can be formed on a substrate by interference exposure, a focused ion beam or any other means.

(5) The minute structure manufacturing method of the present invention makes use of both an interference lithography process and a self-assembly process represented by anodizing, thereby overcoming the problem that a pattern having a high aspect ratio cannot be formed by the conventional interference lithography because of use of interference waves consisting of sine wave components.

(6) Interference lithography preferably used according to the present invention has the advantage of making, at a much lower cost, an orderly nanostructure having a much larger area in comparison with semiconductor processing techniques such as x-ray lithography and electron beam lithography. Also, it does not damage a processed object because it does not require directly forming a recess-projection pattern on the processed object by electron beam drawing or the like. The method of the present invention is practical in these respects.

(7) The present invention enables application of anodic alumina pores in various forms, and largely increase its range of application. Nanostructures according to the present invention themselves can be used as functional materials, and can also be used as matrices or molds for further novel nanostructures.

(8) According to the nanostructure manufacturing method of the present invention, the position of the bottom of alumina nanoholes can be controlled precisely, because recesses provided on the substrate correspond at the bottom of alumina nanoholes.

What is claimed is:

1. A structure comprising:
   an electrical conductor;
   an insulator formed on the electrical conductor; and
   an anodized layer formed on the insulator,
   wherein the insulator has a first group of holes and the anodized layer has a second group of holes,
   wherein each one hole of the first group of holes is connected with a corresponding one hole of the second group of holes, and
   wherein holes of the second group are connected with the electrical conductor.

2. The structure according to claim 1, wherein the electrical conductor consists of Si.

3. The structure according to claim 1, wherein the insulator consist of $SiO_2$.

4. The structure according to claim 1, wherein the insulator contains a resist.

5. The structure according to claim 1, wherein the holes of the first group extend to the electrical conductor.

6. A structure comprising:
   an electrical conductor;
   an insulator formed on the electrical conductor; and
   an anodized layer formed on the insulator,
   wherein columnar parts composed of a magnetic material extend at least into the insulator and the anodized layer, and
   wherein bottoms of the columnar parts contact the electrical conductor.

7. The structure according to claim 6, wherein the electrical conductor consists of Si.

8. The structure according to claim 6, wherein the insulator consists of $SiO_2$.

9. The structure according to claim 6, wherein the insulator contains a resist.

* * * * *

UNITED STATES PATENT AND TRADEMARK OFFICE
CERTIFICATE OF CORRECTION

PATENT NO.    : 6,924,023 B2
DATED         : August 2, 2005
INVENTOR(S)   : Hiroshi Ohkura et al.

It is certified that error appears in the above-identified patent and that said Letters Patent is hereby corrected as shown below:

Title page,
Item [57], ABSTRACT,
Line 1, "nonostructure," should read -- nanostructure, --.

Column 1,
Lines 55 and 56, "namometers" should read -- nanometers --.

Column 2,
Line 11, "Also" should read -- also --.

Column 4,
Line 28, "A:" should read -- ¶ A: --; and
Line 49, "substate" should read -- substrate --.

Column 6,
Line 12, "from" should read -- form --.

Column 8,
Line 32, "(projections)" should read -- projections) --.

Column 9,
Line 22, "Finally," should read -- ¶ Finally, --;
Line 27, "The" should read -- ¶ The --; and
Line 30, "In" should read -- ¶ In --.

Column 10,
Line 38, "3B1." should read -- 3B1). --; and
Line 62, "having" should read -- was formed having --.

Column 12,
Line 24, "steps" should read -- step --.

UNITED STATES PATENT AND TRADEMARK OFFICE
CERTIFICATE OF CORRECTION

PATENT NO. : 6,924,023 B2
DATED : August 2, 2005
INVENTOR(S) : Hiroshi Ohkura et al.

It is certified that error appears in the above-identified patent and that said Letters Patent is hereby corrected as shown below:

<u>Column 14,</u>
Line 1, "(λ325" should read -- (λ=325 --; and

Line 15, " $\underline{\sqrt{3} \times 230 = 266 \text{ nm}}$ " should read -- $\underline{\sqrt{3} \times 230 \approx 266 \text{ nm}}$ --.

Signed and Sealed this

Seventh Day of February, 2006

JON W. DUDAS
*Director of the United States Patent and Trademark Office*